United States Patent
Maejima

(10) Patent No.: US 9,524,789 B2
(45) Date of Patent: *Dec. 20, 2016

(54) SEMICONDUCTOR MEMORY DEVICE

(71) Applicant: KABUSHIKI KAISHA TOSHIBA, Tokyo (JP)

(72) Inventor: Hiroshi Maejima, Setagaya Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/073,555

(22) Filed: Mar. 17, 2016

(65) Prior Publication Data

US 2016/0203874 A1  Jul. 14, 2016

Related U.S. Application Data

(63) Continuation of application No. 14/189,962, filed on Feb. 25, 2014, now Pat. No. 9,324,442.

(30) Foreign Application Priority Data

Aug. 13, 2013  (JP) ................... 2013-168181

(51) Int. Cl.
| | | |
|---|---|---|
| *G11C 16/26* | (2006.01) | |
| *G11C 16/04* | (2006.01) | |
| *G11C 16/06* | (2006.01) | |
| *G11C 7/04* | (2006.01) | |

(52) U.S. Cl.
CPC ............ *G11C 16/26* (2013.01); *G11C 7/04* (2013.01); *G11C 16/0483* (2013.01); *G11C 16/06* (2013.01)

(58) Field of Classification Search
CPC .................................... G11C 16/26

USPC .................................. 365/185.18
See application file for complete search history.

(56) References Cited

U.S. PATENT DOCUMENTS

| 8,233,324 B2 | 7/2012 | Sharon et al. | |
|---|---|---|---|
| 8,582,381 B2 | 11/2013 | Oowada et al. | |
| 2008/0304316 A1* | 12/2008 | Mokhlesi | G11C 16/26 365/185.2 |
| 2010/0097856 A1* | 4/2010 | Elmhurst | G11C 16/0483 365/185.03 |
| 2011/0235420 A1 | 9/2011 | Sharon et al. | |
| 2012/0243327 A1* | 9/2012 | Iwai | G11C 11/5642 365/185.21 |

(Continued)

FOREIGN PATENT DOCUMENTS

JP  2012-169002 A  9/2012

OTHER PUBLICATIONS

Japanese Final Office Action dated May 17, 2016, filed in Japanese counterpart Application No. 2013-168181, 3 pages (with translation).

*Primary Examiner* — Hoai V Ho
*Assistant Examiner* — Tri Hoang
(74) *Attorney, Agent, or Firm* — Patterson & Sheridan, LLP

(57) ABSTRACT

A semiconductor memory device includes a memory cell, a sense amplifier electrically connected to the memory cell, the sense amplifier including a node for sensing a voltage during a sense operation and a data latch electrically connected to the node and configured to hold a first voltage corresponding to a voltage of the node when a strobe signal is issued during a strobe operation, and a controller configured to raise the voltage of the node during the strobe operation before the strobe signal is issued.

17 Claims, 8 Drawing Sheets

(56) References Cited

U.S. PATENT DOCUMENTS

| | | | |
|---|---|---|---|
| 2013/0155777 A1* | 6/2013 | Chen .................... | G11C 16/26 365/185.25 |
| 2013/0208544 A1* | 8/2013 | Chen .................... | G11C 16/06 365/185.21 |
| 2014/0369132 A1 | 12/2014 | Cernea | |
| 2015/0009756 A1 | 1/2015 | D'Alessandro et al. | |

* cited by examiner

SEMICONDUCTOR MEMORY DEVICE

CROSS-REFERENCE TO RELATED APPLICATION

This application is a continuation of U.S. patent application Ser. No. 14/189,962, filed Feb. 25, 2014, now U.S. Pat. No. 9,324,442, issued on Apr. 26, 2016, which is based upon and claims the benefit of priority from Japanese Patent Application No. 2013-168181, filed Aug. 13, 2013, the entire contents of which are incorporated herein by reference.

FIELD

Embodiments described herein relate generally to a semiconductor memory device.

BACKGROUND

NAND flash memory is a known memory device in the related art.

DETAILED DESCRIPTION

In general, according to one embodiment, there is provided a semiconductor memory device capable of normal operation.

According to the embodiment, a semiconductor memory device includes a memory cell, a sense amplifier electrically connected to the memory cell, the sense amplifier including a node for sensing a voltage during a sense operation and a data latch electrically connected to the node and configured to hold a first voltage corresponding to a voltage of the node when a strobe signal is issued during a strobe operation, and a controller configured to raise the voltage of the node during the strobe operation before the strobe signal is issued.

Preferred embodiments will be hereinafter described with reference to the drawings. In the following description, the same symbols are attached to the same components having the same function and the same structure and the description will be repeated only as needed. The drawings are schematic views. The respective embodiments are to illustrate a device and a method for realizing the technical spirit of the embodiments, not to specify the particular material, shape, structure, and arrangement of the components.

The respective function blocks can be realized by either hardware or computer software, or a combination of the both. Hereinafter, the respective function blocks will be described generally from a viewpoint of the functions. Those skilled in the art should recognize that these functions can be realized in various ways, and any such way is included in the scope of the embodiments. The respective function blocks are not required to be embodied in the specific manner as they are in the following examples. For example, a part of the functions may be executed by another function block different from the illustrated function block. Further, the illustrated function block may be further divided into smaller function sub-blocks. The embodiments are not to be restricted even if a function block is described as executing a particular function.

First Embodiment

Figure 1:
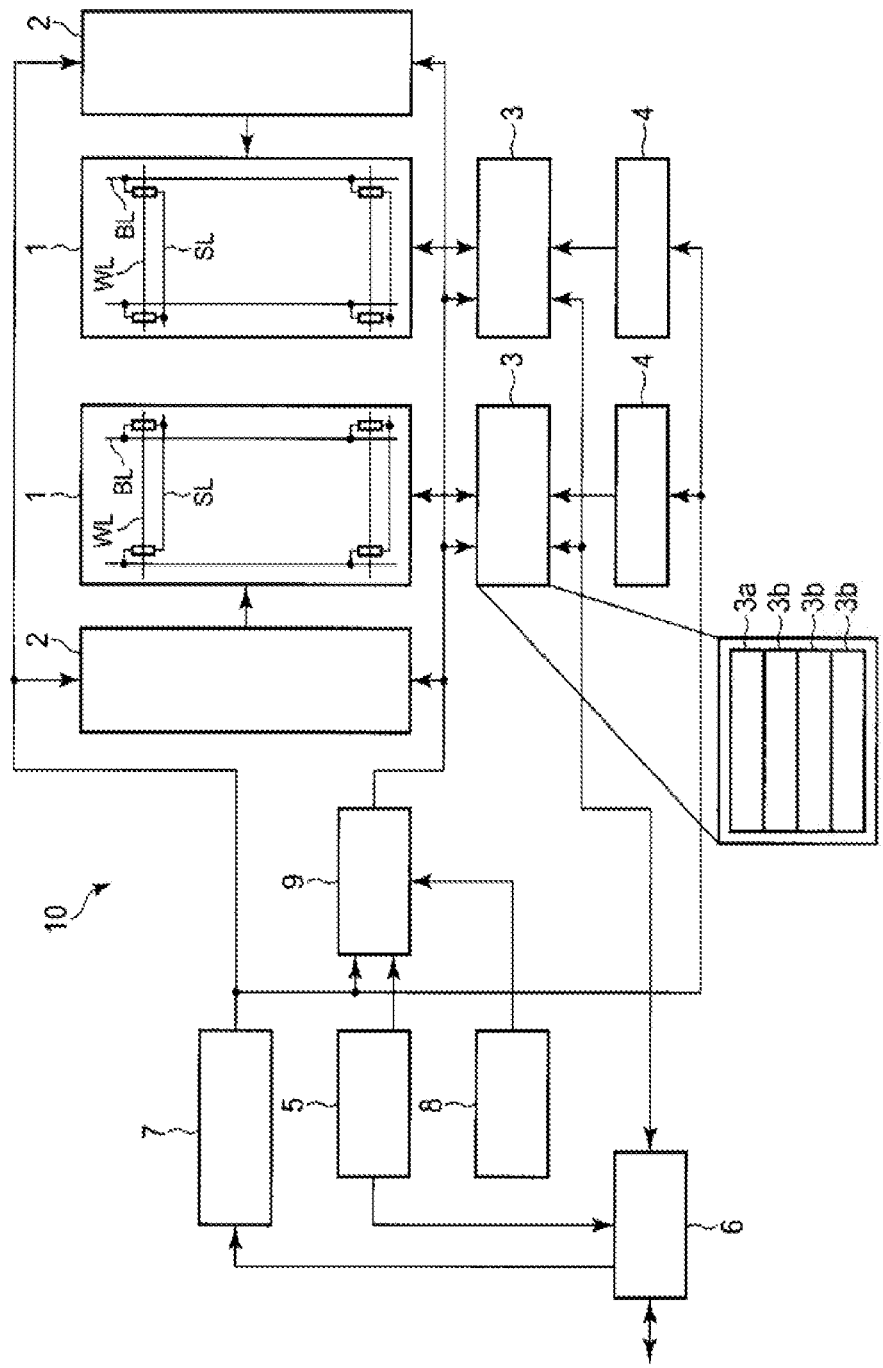
FIG. 1 is a block diagram of a memory device according to a first embodiment.

FIG. 1 is a block diagram of a memory (semiconductor memory device) 10 according to a first embodiment. As illustrated in FIG. 1, the memory 10 includes elements such as a memory cell array 1, a row decoder 2, a data circuit and page buffer 3, a column decoder 4, a controlling circuit 5, an input and output circuit 6, an address and command register 7, a voltage generating circuit 8, and a core driver 9.

The memory 10 includes a plurality of memory cell arrays (two memory cell arrays are illustrated) 1. The memory cell array 1 is sometimes referred to as a memory plane. The memory cell array 1 includes a plurality of physical blocks. Each of the physical blocks includes a plurality of memory cells, word lines WL, bit lines BL, and source lines SL.

A set including the row decoder 2, the data circuit and page buffer 3, and the column decoder 4 is provided for every memory cell array 1. The row decoder 2 receives a block address signal from the address and command register 7 and also receives a word line control signal and a select gate line control signal from the core driver 9. According to the received block address signal, word line control signal, and select gate line control signal, the row decoder 2 selects a physical block and a word line.

The data circuit and page buffer 3 temporarily stores data read from the memory cell array 1, receives write data from the outside of the memory 10, and writes the received data into the selected memory cell. The data circuit and page buffer 3 includes a sense amplifier 3a. The sense amplifier 3a includes a plurality of sense amplifier units respectively connected to a plurality of bit lines BL, reads the data of a memory cell within the memory cell array 1 through a bit line, and detects the state of the memory cell through the bit line. The memory 10 can store data of two (or more) bits in one memory cell. Therefore, the data circuit and page buffer 3 includes, for example, three data caches 3b. The first data cache 3b stores one of the lower page data and the upper page data, and the second data cache 3b stores the other of the lower page data and the upper page data. The lower page data contains the set of lower bits of the respective two bit data of the relevant memory cells. The upper page data contains the set of upper bits of the respective two bit data of the relevant memory cells. The third data cache 3b stores, for example, temporary data to be rewritten into a memory cell based on the result of verify-read.

The column decoder 4 receives a column address signal from the address and command register 7 and decodes the received column address signal. Based on the decoded address signal, the column decoder 4 controls input and output of data in and from the data circuit and page buffer 3.

The controlling circuit 5 receives commands for instructing read, write, and erase, from the address and command register 7. The controlling circuit 5 controls the voltage generating circuit 8 and the core driver 9 according to a predetermined sequence based on the respective commands. The voltage generating circuit 8 generates various voltages according to an instruction of the controlling circuit 5. The core driver 9 controls the row decoder 2 and the data circuit and page buffer 3 in order to control the word line WL and the bit line BL, according to the instruction of the controlling circuit 5. The input and output circuit 6 controls the input of the commands, address, and data from the outside of the memory 10 or the output thereof to the outside of the memory 10.

Figure 2:
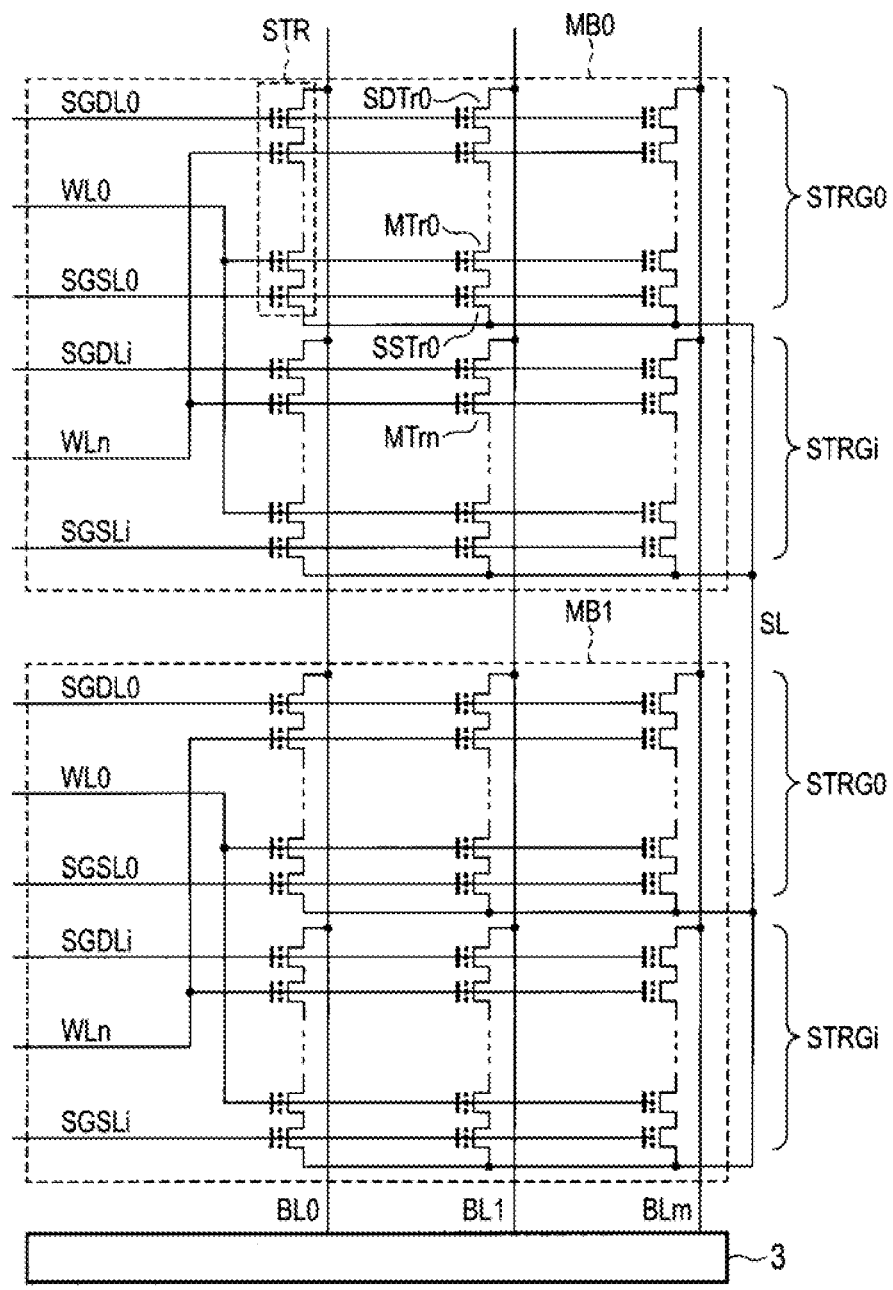
FIG. 2 is a circuit diagram showing a part of a memory cell array according to the first embodiment.

The memory cell array 1 has the elements and connections illustrated in FIG. 2. FIG. 2 is a circuit diagram showing a part of the memory cell array (two physical blocks MB) according to the first embodiment. As illustrated in FIG. 2, the memory cell array 1 includes a plurality of bit lines BL, a source (cell source) line SL, and a plurality of physical blocks MB. In each of the physical blocks MB, i+1 strings STR are connected to one bit line BL.

One string STR includes n+1 (n is, for example, 15) memory cell transistors MTr0 to MTr15 connected in series, a select gate transistor SSTr on the source side, and a select gate transistor SDTr on the drain side. When the individual units with the same reference labels but with different numerals at the end do not have to be distinguished from each other, they will be described with the numeral at the end omitted (for example, cell transistor MTr) and such description will apply to all the individual units having the same reference label.

In each string STR, the drain of the transistor SSTr is connected to the source of the cell transistor MTr0. The source of the transistor SDTr is connected to the drain of the cell transistor MTr15. The source of the transistor SSTr is connected to the source line SL. The drain of the transistor SDTr is connected to one corresponding bit line BL.

A plurality of strings aligned along the extending direction of the word lines WL form a string group STRG. For example, all the plural strings STR aligned along the extending direction of the word line WL and respectively connected to all the bit lines BL form one string group STRG. In each of the string groups STRG, the respective gates of the respective cell transistors MTr0 in the plural strings STR are connected to the word line WL0 in common. Similarly, in each of the string groups STRG, the respective gates of the respective cell transistors MTrX in the plural strings STR are connected to the word line WLX in common.

In each of the string groups STRG, the respective gates of the respective transistors SDTr in the plurality strings STR are connected to the select gate line SGDL on the drain side in common. The select gate lines SGDL0 to SGDLi are respectively provided for the string groups STRG0 to STRGi.

In each of the string groups STRG, the respective gates of the respective transistors SSTr in the plural strings STR are connected to the select gate line SGSL on the source side in common. The select gate lines SGSL0 to SGSLi are respectively provided for the string groups STRG0 to STRGi.

The structure of the memory cell array 1 is disclosed in, for example, U.S. patent application Ser. No. 12/407,403 entitled "Three Dimensional Stacked Nonvolatile Semiconductor Memory" filed Mar. 19, 2009. Further, it is disclosed in U.S. patent application Ser. No. 12/406,524 entitled "Three Dimensional Stacked Nonvolatile Semiconductor Memory" filed Mar. 18, 2009 and in U.S. patent application Ser. No. 12/679,991 entitled "Nonvolatile Semiconductor Memory Device and Method of Manufacturing the Same" filed Mar. 25, 2010, and in U.S. patent application Ser. No. 12/532,030 entitled "Semiconductor Memory and Method of Manufacturing the Same" filed Mar. 23, 2009. These patent applications are referred to and used in this disclosure, and the entire disclosures thereof are incorporated by reference herein.

A plurality of cell transistors MTr connected to the same word line WL in one string group STRG form a physical unit. One physical unit has a memory capacity of one or more pages. One page may be formed by the memory capacity for a part of the cell transistors MTr of the physical unit. Data is read by page unit. Writing may be performed for every page or every physical unit.

In the respective physical blocks MB, the word lines WL having the same number, of the different strings STR, are connected together. Namely, for example, the word lines WL0 of all the strings of one physical block MB are connected together and the word lines WLX are connected together.

In order to gain access to the cell transistor MTr, one physical block MB is selected and one string group STRG is selected. In order to select a physical block MB, a signal for selecting a physical block MB is supplied only to the physical block MB specified by a physical block address signal. In accordance with the physical block select signal, the word line WL and the select gate lines SGSL and SGDL are connected to a driver in the select physical block MB.

Further, in order to select one string group STRG, the select transistors SSTr and SDTr of only the select string group STRG receive a select voltage. The select transistors SSTr and SDTr of a non-select string group STRG receive a non-select voltage. The select voltage depends on the reading and writing operation. Similarly, the non-select voltage also depends on the reading and writing operation.

Figure 3:
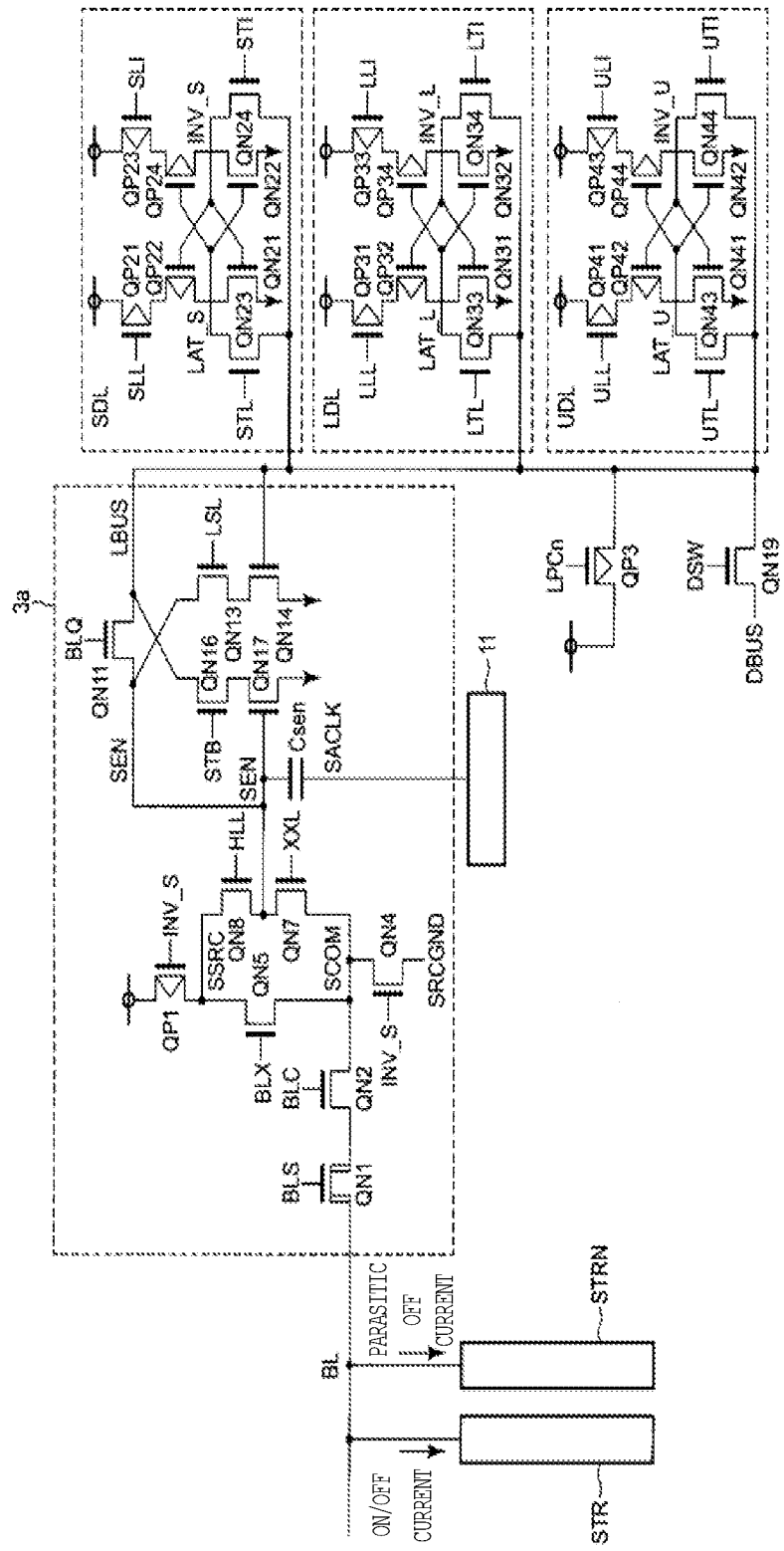
FIG. 3 is a circuit diagram showing a part of a semiconductor memory device according to the first embodiment.

FIG. 3 is a circuit diagram showing a part of the semiconductor memory device according to the first embodiment. More specifically, FIG. 3 is a circuit diagram showing a part of the core driver 9 and the data circuit and page buffer 3 of FIG. 1 and further showing the sense amplifier unit, latch, and other elements with respect to one bit line BL. As mentioned above, a plurality of strings STR are connected to the bit line BL. During the reading operation, one of the plural strings STR connected to this bit line BL works as the select string STR and the others work as the non-select strings STRN, in every bit line BL.

As illustrated in FIG. 3, the bit line BL is connected to a node SCOM through n-type MOSFETs QN1 and QN2 connected in series. The transistors QN1 and QN2 respectively receive signals BLS and BLC from the core driver 9 in their gates. The signals BLS and BLC are set at a high level in order to connect the bit line BL to the sense amplifier 3a.

The node SCOM is connected to a node SRCGND through an n-type MOSFET QN4. The transistor QN4 receives a signal INV_S from the core driver 9 in its gate. The node SRCGND has the ground (common) potential VSS. The signal INV_S controls the data latch (a part of the data cache 3b) described later and it is turned on or off in order to control the data to be written into the cell transistor MTr.

The node SCOM is also connected to a power node (node of power VDD) through an n-type MOSFET QN5 and a p-type MOSFET QP1 connected in series. The transistors QN5 and QP1 respectively receive signals BLX and INV_S from the core driver 9 in their gates. The signal BLX is regarded as a high level during the reading operation.

The node SCOM is further connected to a node SEN through an n-type MOSFET QN7. The result of sensing the potential on the bit line BL appears on the node SEN. The transistor QN7 receives a signal XXL from the core driver 9 in its gate. The signal XXL is set at a high level in order to connect the node SCOM and the node SEN for precharging the bit line BL, during the period from a start of the precharge of the bit line BL to a start of strobe. The strobe indicates the operation for taking the result of a sense (the potential on the node SEN) into the latch (cache 3b).

The node SEN is connected to a node SSRC through an n-type MOSFET QN8. The node SSRC is connected between the transistors QN5 and QP1. The transistor QN8 receives a signal HLL from the core driver 9 in its gate. The signal HLL is set at a high level in order to connect the node SSRC and the node SEN to precharge the bit line BL, during the period from a start of the precharge of the bit line BL to a start of a sense.

The node SEN receives a signal SACLK through a capacitor Csen. The signal SACLK is supplied from a SACLK driver 11. The SACLK driver 11 is included in the core driver 9. The node SEN is further connected to a node LBUS through an n-type MOSFET QN11. The transistor QN11 receives a signal BLQ from the core driver 9 in its gate. The signal BLQ is set at a low level during the reading operation (sense operation), to separate the node SEN and the node LBUS.

The node SEN is grounded through n-type MOSFETs QN13 and QN14 connected in series. The transistor QN13 receives a signal LSL from the core driver 9 in its gate. The signal LSL is used to control the logical operation for mutual data among a plurality of data latches described later. The transistor QN14 is connected to the node LBUS in its gate.

The node LBUS is grounded through n-type MOSFETs QN16 and QN17 connected in series. The transistor QN16 receives a signal STB from the core driver 9 in its gate. The signal STB is set at a high level in order to trigger the strobe. The transistor QN17 is connected to the node SEN in its gate.

The node LBUS is further connected to the power node through a p-type MOSFET QP3. The transistor QP3 receives a signal LPCn from the core driver 9 in its gate. The transistor QP3 is used to precharge the node LBUS and is turned on according to a start of reading (sense). The node LBUS is further connected to a data bus DBUS through an n-type MOSFET QN19. The data bus DBUS corresponds to an element between the data circuit and page buffer 3 and the input and output circuit 6 of FIG. 1. The transistor QN19 receives a signal DSW from the core driver 9 in its gate. The signal DSW is set at a high level when transferring data on the node LBUS to the data bus DBUS after reading the data.

The transistors QN1, QN2, QN4, QN5, QN7, QN8, QN11, QN13, QN14, QN16, QN17, QN19, QP1, QP3, and the capacitor Csen are included in the sense amplifier 3a of FIG. 1.

The node LBUS is connected to latches SDL, LDL, and UDL. The latches SDL, LDL, and UDL form a part of the data cache 3b. The latch SDL includes p-type MOSFETs QP21 and QP22 and n-type MOSFET QN21 connected in series between the power node and a ground node (node of the ground potential). Further, the latch SDL includes p-type MOSFETs QP23 and QP24 and an n-type MOSFET QN22 connected in series between the power node and the ground node. The transistors QP21 and QP23 respectively receive signals SLL and SLI from the core driver 9 in their gates. The gates of the transistors QP24 and QN22 are connected together, forming a node LAT S, and connected to the node LBUS through an n-type MOSFET QN23. The transistor QN23 receives a signal STL from the core driver 9 in its gate. The gates of the transistors QP22 and QN21 are connected together, forming a node INV_S, and connected to the node LBUS through an n-type MOSFET QN24. The transistor QN24 receives a signal STI from the core driver 9 in its gate. The signals SLL, SLI, STL, and STI are set at a high or a low level in order to control the latch SDL to take in the data on the node LBUS or to transfer the data to the node LBUS.

The latch LDL includes p-type MOSFETs QP31 and QP32 and an n-type MOSFET QN31 connected in series between the power node and the ground node. Further, the latch LDL includes p-type MOSFETs QP33 and QP34 and an n-type MOSFET QN32 connected in series between the power node and the ground node. The transistors QP31 and QP33 respectively receive signals LLL and LLI from the core driver 9 in their gates. The gates of the transistors QP34 and QN32 are connected together, forming a node LAT L, and connected to the node LBUS through an n-type MOSFET QN33. The transistor QN33 receives a signal LTL from the core driver 9 in its gate. The gates of the transistors QP32 and QN31 are connected together, forming a node INV L, and connected to the node LBUS through an n-type MOSFET QN34. The transistor QN34 receives a signal LTI from the core driver 9 in its gate. The signals LLL, LLI, LTL, and LTI are set at a high or a low level in order to control the latch LDL to take in the data on the node LBUS or to transfer the data to the node LBUS.

The latch UDL includes p-type MOSFETs QP41 and QP42 and an n-type MOSFET QN41 connected in series between the power node and the ground node. Further, the latch UDL includes p-type MOSFETs QP43 and QP44 and an n-type MOSFET QN42 connected in series between the power node and the ground node. The transistors QP41 and QP43 respectively receive signals ULL and ULI from the core driver 9 in their gates. The gates of the transistors QP44 and QN42 are connected together, forming a node LAT_U, and connected to the node LBUS through an n-type MOSFET QN43. The transistor QN43 receives a signal UTL from the core driver 9 in its gate. The gates of the transistors QP42 and QN41 are connected together, forming a node INV U, and connected to the node LBUS through an n-type MOSFET QN44. The transistor QN44 receives a signal UTI from the core driver 9 in its gate. The signals ULL, ULI, UTL, and UTI are set at a high or a low level in order to control the latch UDL to take in the data on the node LBUS or transfer the data to the node LBUS.

As mentioned above, a plurality of strings STR are connected between one bit line BL and the common source line SL. In order to increase the capacity of a memory including the memory 10, the number of the cell transistors within one string is increased. As a result of an increase in the number of the cell transistors, on-current flowing in a cell transistor targeted for reading data is decreased. Further, a leak current flows through a parasitic element from the bit line. This parasitic leakage current is added to the off current of the cell transistor targeted for reading data. A decrease in the on current and an increase in the off current induce a decrease in the ratio of the on current and the off current.

If, for example, the worst value of the on current flowing in the cell transistor is 21 nA and the worst value of the off current is 7 nA, when each combination of each value for two bits in a two-bit capacity cell is referred to as Er, A, B, and C level, the least current that the cell of A level sends (the current of the cell positioned at the upper end of the threshold distribution) is 21 nA and the largest current that the cell of B level sends (the current of the cell positioned at the lower end of the threshold distribution) is 7 nA when the lower page is read using the threshold for determining the B level. The on and off current ratio is thus 21 nA:7 nA=3:1. From the viewpoint of the sense amplifier, the parasitic leakage current of a non-select string STRN flows whenever the select string STR passes the on current or the off current, and therefore, for example, when the parasitic leakage current is 7 nA, the on and off current ratio from the viewpoint of the sense amplifier becomes (21 nA+7 nA):(7 nA+7 nA)=2:1. Namely, due to the parasitic leakage current, the on and off current ratio is deteriorated from 3:1 to 2:1 and the sense margin is reduced. The on and off current ratio required for the sense amplifier determined according to the variation in the performance on the circuit (variation of timing and threshold scattering of a detection circuit) is about 2:1. Therefore, the reduced on and off current ratio 2:1 induces a high possibility of causing a sense error. In the non-three dimensional NAND flash memory, the off current has affected the performance comparatively less even without any countermeasure, and there has been no serious problem such as an enormous increase in reading time and a reading incapability.

In the memory having a three dimensional structure (referred to as three dimensional memory) as disclosed in U.S. patent application Ser. No. 12/407,403, Ser. No. 12/406,524, Ser. No. 12/679,991, and Ser. No. 12/532,030, however, the on current of a cell transistor is smaller than that in the NAND flash memory of non-three dimensional structure (referred to as a plane memory). Further, in the memory with a plurality of strings STR connected between one bit line BL and the source line SL, such as the memory 10, one string is selected at a time of reading and a non-select string contributes an increase of the parasitic leakage current flowing out from the bit line. Therefore, in such a memory, the off current of a cell transistor targeted for reading data is larger than that in the plane memory. According to the above, in a memory with a plurality of strings connected to one bit line, the on and off current ratio is smaller than that in the plane memory and the reading is more difficult. Depending on the case, reading may be impossible. Namely, a decrease in the on and off current ratio affects the performance remarkably.

FIG. 3 typically shows a select string STR and a non-select string STRN. In the select string STR, the on current or off current flows from the bit line BL. Further, in the non-select string STRN, a leakage current (parasitic off current) flows from the bit line BL as mentioned above. FIG. 3 shows these currents.

Figure 4:
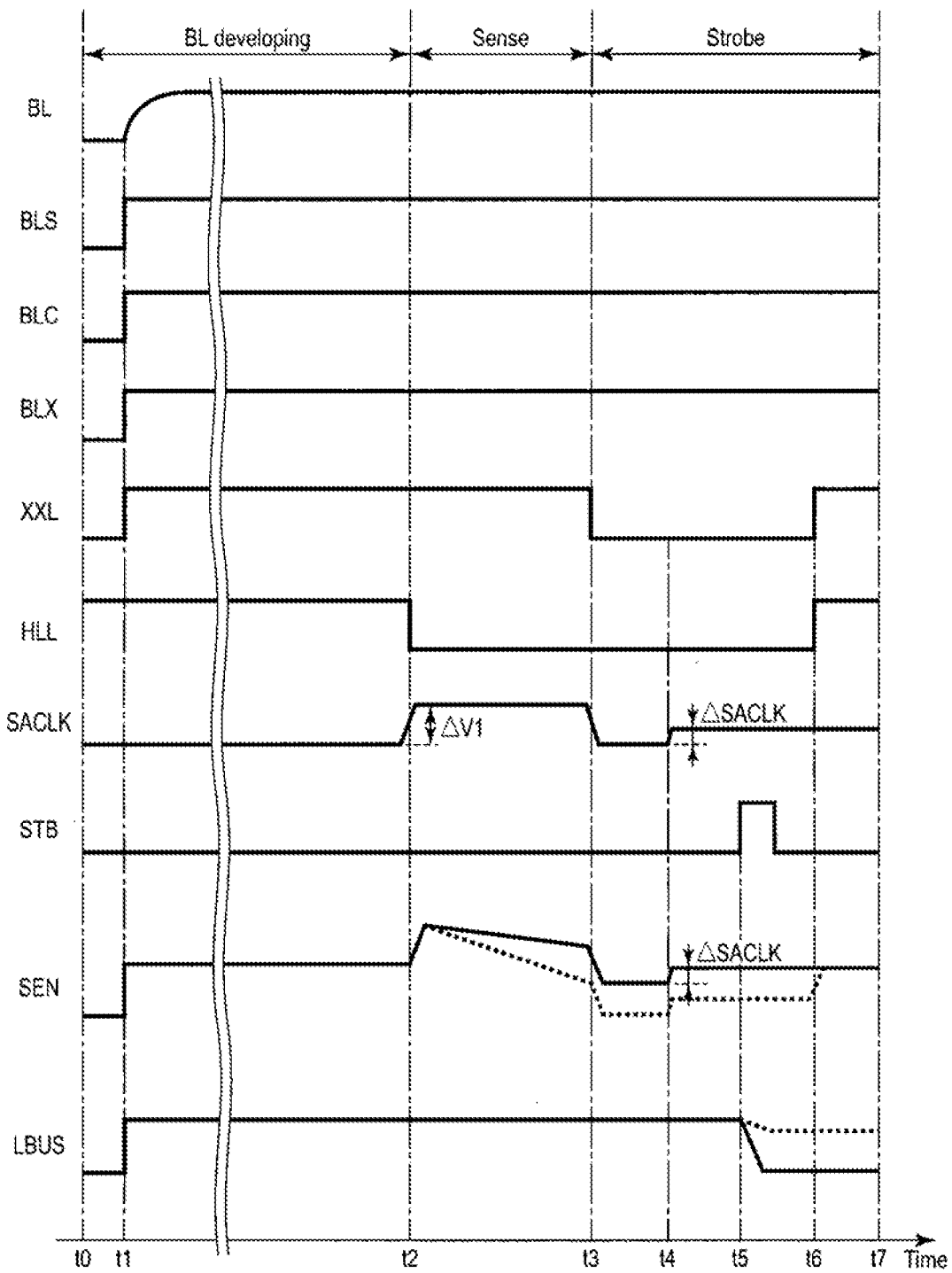
FIG. 4 is a timing chart of potentials at various nodes of the memory device according to the first embodiment.

In order to cope with the above decrease in the on and off current ratio in the select string STR, the memory 10 is configured as follows. The description will be made with reference to FIGS. 3 and 4. FIG. 4 is a timing chart of the potentials at various nodes at a time of reading data from the memory according to the first embodiment with the circuit of FIG. 3. The specific value of each potential in the following description is just one example and the potentials do not have to be restricted to these values.

As illustrated in FIG. 4, at time t1, precharge of the bit line BL and the node SEN starts. Therefore, the signals (node) BLS, BLC, BLX, XXL, and HLL are defined as follows. The signal BLS is, for example, 7 V. The signal BLC is the sum of, for example, 0.5 V and the threshold voltage (Vt) of the transistor QN2. The signal BLX is the sum of, for example, 0.75 V and the threshold voltage (Vt) of the transistor QN5. The signal XXL is the sum of, for example, 1.0 V and the threshold voltage (Vt) of the transistor QN7. The signal HLL is, for example, 4 V. The signals SRCGND and BLQ are kept at a low level (ground potential VSS) during the reading. According to the above potentials, at the time t1, the bit line BL and the node SEN are each precharged to a predetermined potential (for example, 0.5 V and 2.5 V respectively). Further, the signal STB is kept at a low level until time t5 described later. Therefore, the potential of the node LBUS is precharged to the same potential as that of the node SEN, until the signal STB shifts to a high level. The signal SACLK is kept at the potential VSS even at the time t1.

At time t2, the signal HLL is turned to a low level, to turn off the transistor QN8, hence to finish the precharge of the node SEN. As a result, the potential of the node SEN is decreased according to the size of the current flowing into the cell transistor connected to the bit line BL. Namely, when the cell transistor connected to the bit line BL has "0" data, the current flowing into the cell transistor is small so that the potential of the node SEN is gradually reduced; while when the cell connected to the bit line BL has "1" data, the current flowing into the cell transistor is large so that the potential of the node SEN is rapidly reduced. FIG. 4 illustrates the potential of the node SEN in the case of reading "0" data with a solid line and in the case of reading "1" data with a dotted line.

At the time t2, the potential of the signal SACLK goes up by $\Delta V1$ and until time t3, the above higher state is kept. According to the rise of the signal SACLK, the potential of the node SEN also goes up at the time t2. The potential of the node SEN is raised because a drop in the potential of the node SEN is otherwise restricted to a specified value. Especially, the potential of the node SEN in the case of reading "1" data cannot be fully decreased and the potential drop is limited to the specified value, which decreases the sense margin between the case of reading the "0" data and the case of reading the "1" data. In order to avoid this, the potential of the node SEN is raised.

A decrease in the potential of the node SEN, namely, a sense continues to the time t3. Further, at the time t3, the signal SACLK is set at the potential VSS and therefore, the potential of the node SEN is decreased by the same amount it was raised by the signal SACLK. Further, at the time t3, the signal XXL is turned to a low level, to turn off the transistor QN7, thereby to cut off the node SEN and the bit line BL.

At time t4, the potential of the signal SACLK is raised up by $\Delta SACLK$. The rise of the potential of the signal SACLK is performed at least before a rise of the signal STB, which is described later. This potential rise of the signal SACLK is based on the fact that the parasitic leakage current is added to the on current flowing in the cell transistor MTr targeted for reading data when it is turned on and also added to the off current flowing in the cell transistor MTr targeted for reading data when it is turned off. Namely, due to the parasitic leakage current, the potential in the node SEN under the sense is decreased and this decrease is compensated by the rise of the signal SACLK. According to this compensation, the on and off current ratio can achieve the same value as when there is no parasitic leakage current, namely, 3:1 in the above example. The up amount $\Delta SACLK$ is determined on the basis of the potential of the signal SACLK at the time of finishing the sense (t3).

The up amount $\Delta SACLK$ is set, for example, equal to the decreased amount of the potential in the node SEN due to the parasitic leakage current. The concrete example will be described below. The parasitic leakage current I_offleak decreases the potential of the node SEN. The decreased amount is ΔVSEN=I_offleak×t_sen/Csen. The variable t_sen indicates the time of sense and it is equal to the time t3 minus the time t2. The variable Csen indicates the capacitance of the capacitor Csen. Here, the node SEN is raised from the time t4 by the decreased amount ΔVSEN. Namely, the amount of the parasitic off current is converted into a voltage value and according to the converted voltage value, the potential of the node SEN is compensated. For example, assuming that I_offleak=7 nA, t_sen=2 μs, and Csen=20 fF, the following equation is satisfied: ΔVSEN=ΔSACLK=0.7 V. According to the rise of ΔSACLK, the node SEN goes up by ΔSACLK (=voltage converted value of the parasitic off current). Namely, the node SEN also gets higher by ΔSACLK than the potential at the point of finishing the sense (t3).

Continuously, at the time t5, the signal STB is set at a high level during a predetermined period. The potential of the node SACLK at this time point is kept higher. Due to the signal STB's shift to a high level, the potential of the node LBUS is decreased from the potential in the precharged state, depending on the potential of the node SEN. For example, when the cell transistor MTr targeted for reading data has "1" data, the node LBUS is kept almost at a high level, as indicated by a dotted line. While, when the cell transistor MTr targeted for reading data has "0" data, the node LBUS is decreased to the potential VSS, as indicated by a solid line. According to this, the potential depending on the data kept by the cell transistor MTr targeted for reading data is transferred to the node LBUS and it is finally latched by the latch (latches SDL, LDL, and UDL) as the data.

Continuously, at time t6, the signals XXL and HLL are returned to a high level. Due to the shift to the high level, the node SEN is returned to the precharge state.

The signal SACLK is raised at least before the strobe (being triggered by the signal STB's shift to a high level). Then, the higher state may be kept or may not. In FIG. 4, as an example, the higher state is kept to the time t7 following the time t6.

Figure 5:
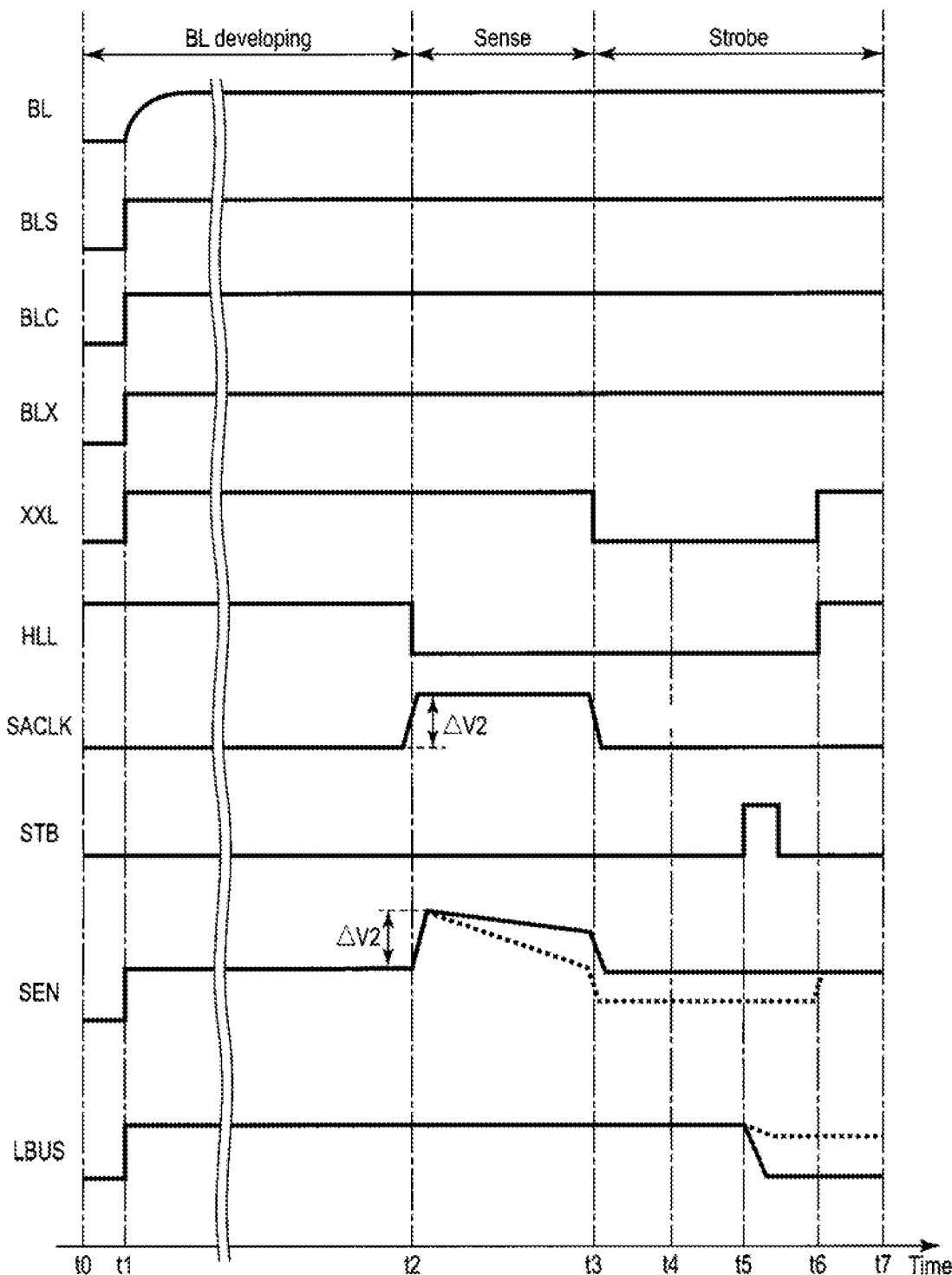
FIG. 5 is another example of the timing chart of the potentials at various nodes of the memory device according to the first embodiment.

The rise of ΔSACLK may be performed at the time t2. FIG. 5 shows such an example and it is another example of a timing chart of the potentials at various nodes at a time of reading data from the memory according to the first embodiment. As illustrated in FIG. 5, at the time t2, the potential of the signal SACLK is raised by ΔV2 and the higher state is kept to the time t3. The ΔV2 has the size of at least adding ΔSACLK to ΔV1. According to the rise of the signal SACLK, at the time t2, the potential of the node SEN goes up, and then, goes down to the size based on the potential stored in the bit line BL depending on the data stored in the cell. At the time t3, the potential of the signal SACLK is decreased to VSS and this state is kept at least to the signal STB's shift to a high level. In FIG. 5, the potential of the signal SACLK is maintained up to the time t7. The potential in each case after the drop of the node SEN is larger by ΔSACLK than the potential in each case where there is no rise of the signal SACLK. This state is caused by adding ΔSACLK to the signal SACLK and kept at least to a start of the strobe. Therefore, similar to the example of FIG. 4, at a point of starting the strobe, the potential of the node SEN is larger by ΔSACLK than that when there is no addition of ΔSACLK to the signal SACLK.

Figure 6:
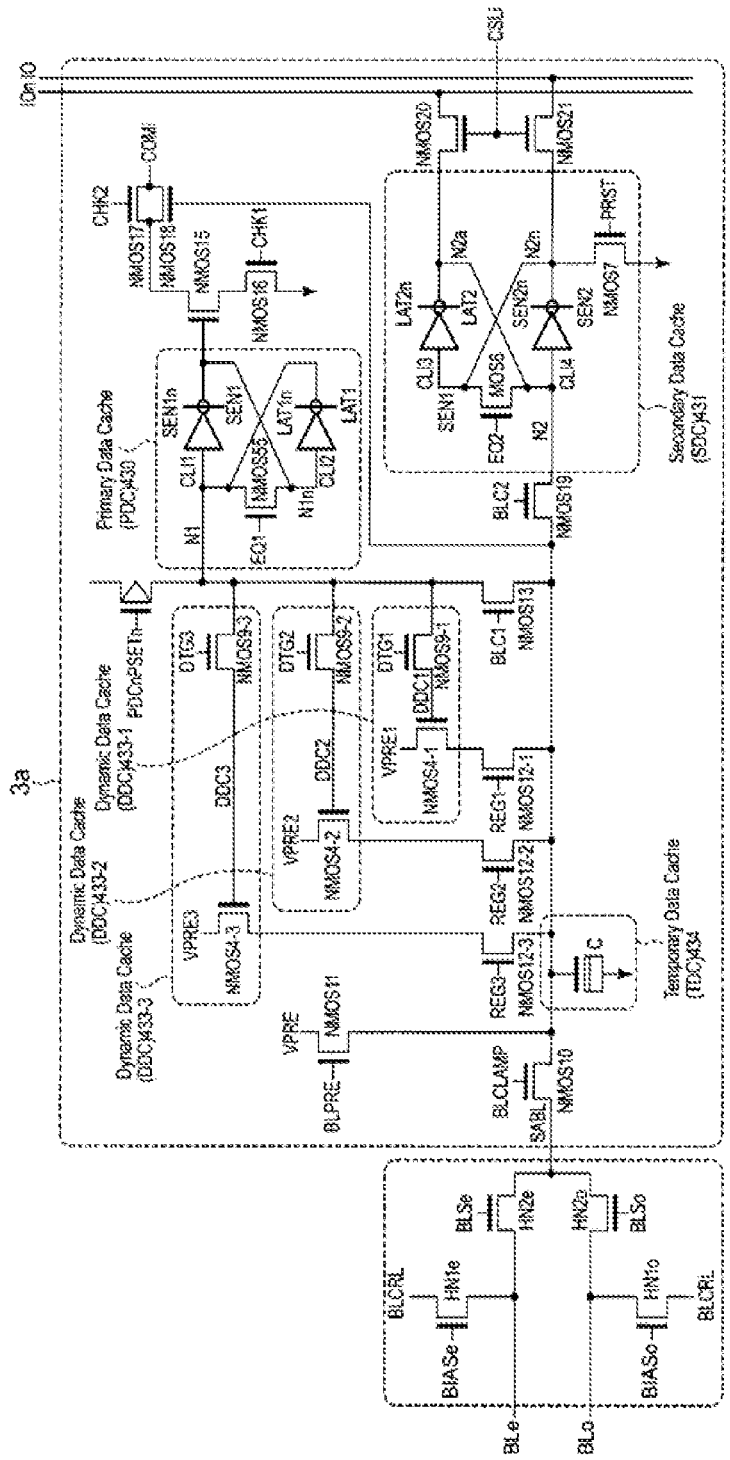
FIG. 6 is another example of the circuit diagram of the semiconductor memory device according to the first embodiment.

The description so far relates to a so-called ABL (all bit line) sensing method. In the ABL method, a sense amplifier (sense amplifier unit) as illustrated in FIG. 3 is provided for one bit line. The embodiments are not restricted to the ABL method but it can be applied to, for example, a method of providing one sense amplifier unit for two bit lines. In this method, bit lines are divided into an even number group and an odd number group and a pair of adjacent bit lines shares one sense amplifier unit. In order to read data of the bit line group of even number, the bit line group of even number is connected to the respective sense amplifier units and the bit line group of odd number is connected to the ground potential. On the other hand, in order to read data of the bit line group of odd number, the bit line group of odd number is connected to the respective sense amplifier units and the bit line group of even number is connected to the ground potential. FIG. 6 shows an example of this method of providing one sense amplifier for two bit lines and is a circuit diagram showing another example of a part of the semiconductor memory device according to the first embodiment, with illustration of a pair of bit lines and a sense amplifier unit, latches, and other elements shared by these bit lines.

As illustrated in FIG. 6, a bit line BLe of the odd number is connected to a node BLCRL through an n-type MOSFET HN1e and further connected to a node SABL through an n-type MOSFET HN2e. A bit line BLo of the even number is connected to the node BLCRL through an n-type MOSFET HN1o and further connected to the node SABL through an n-type MOSFET HN2o. The transistors HN1e, HN2e, HN1o, and HN2o receive signals BIASe, BLSe, BIASo, and BLSo from the core driver 9 in their respective gates. When reading the data of the bit line BLe, the transistors HN2e and HN1o are turned on and the transistors HN1e and HN2o are kept off. The node BLCRL is set at the potential VSS. As a result, the bit line BLe is connected to the node SABL and the bit line BLo is fixed to the potential VSS. On the other hand, when reading the data of the bit line BLo, the bit line BLo is connected to the node SABL and the bit line BLe is fixed to the potential VSS.

The node SABL is connected to a temporary data cache (TDC) 434 (node TDC) through an n-type MOSFET NMOS10. The transistor NMOS10 receives a signal BLCLAMP form the core driver 9 in its gate. The node TDC is further connected to a node VPRE through an n-type MOSFET NMOS11. The transistor NMOS11 receives a signal BLPRE from the core driver 9 in its gate. The node TDC is further connected to a dynamic data cache (DDC) 433 (respectively 433-1 to 433-3) through an n-type MOSFET12 (respectively 12-1 to 12-3). The node TDC is further connected to a primary data cache (PDC) 430 and a secondary data cache (SDC) 431 respectively through n-type MOSFETs NMOS13 and NMOS 19. The secondary data cache 431 is connected to signal lines IOn and IO respectively through n-type MOSFETs NMOS20 and NMOS21. The transistors NMOS12, NMOS13, NMOS19 are turned on or off based on a signal from the core driver 9, in order to control the data input and output to and from the corresponding cache.

Figure 7:
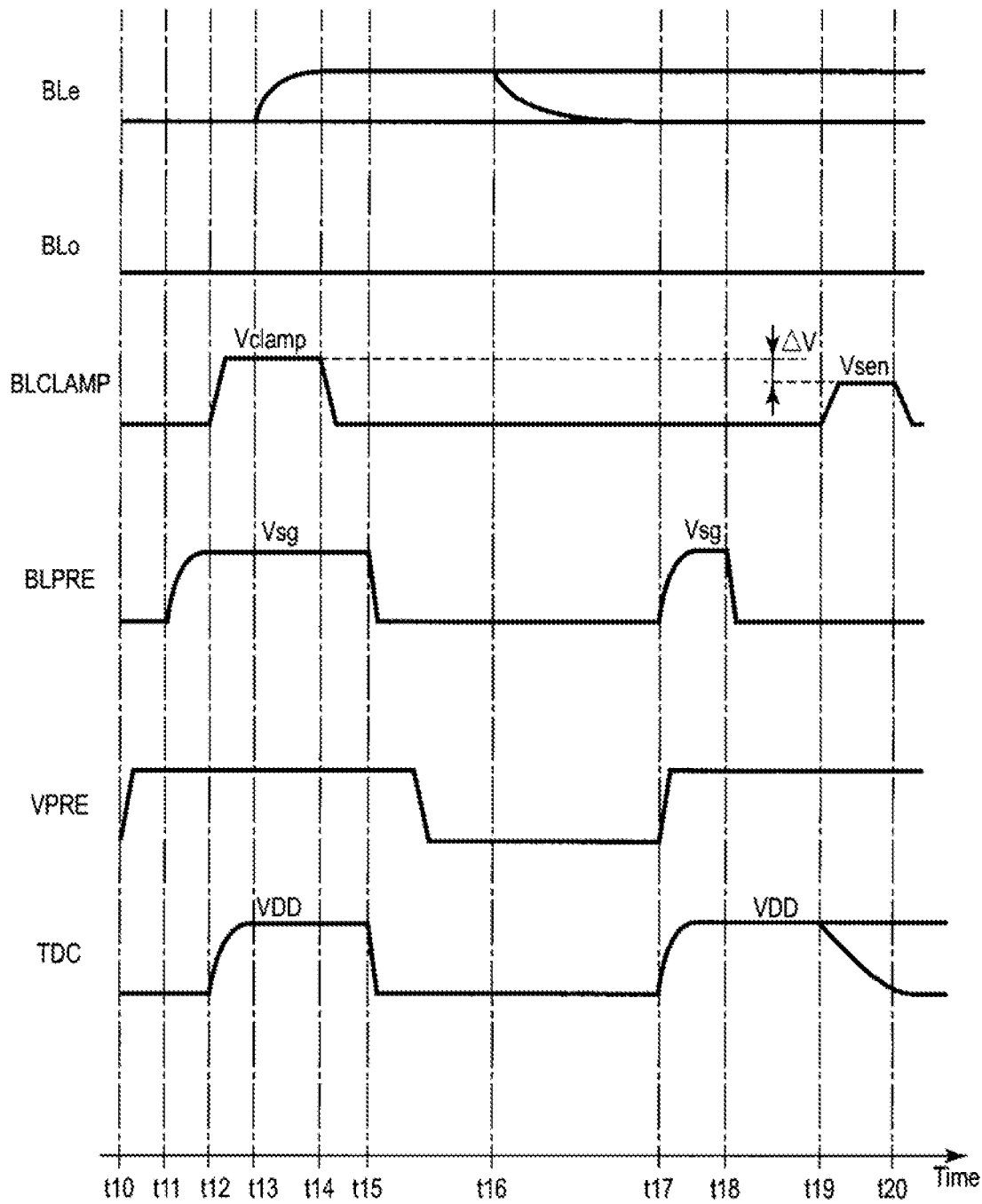
FIG. 7 is another example of the timing chart of potentials at various nodes of the memory device according to the first embodiment.

FIG. 7 is another example of a timing chart of potentials at various nodes when reading data from the memory according to the first embodiment with the circuit in FIG. 6. FIG. 7 shows an example of reading data from the bit line BLe. Although the illustration is omitted in FIG. 7, a control necessary for reading data from the bit line BLe is performed in parallel to the potential fluctuation in FIG. 7. The control includes, for example, a control of the transistors HN2e, HN1o, HN1e, and HN2o, fixation of the node BLCRL to the potential VSS, and a transfer of the potential depending on the date kept by a cell targeted for reading data, to the bit line BLe.

As illustrated in FIG. 7, at times t10 and t11, the sense amplifier (unit) 3a precharges the bit line BLe. Specifically, the node VPRE is set at the potential VDD and at the same time, the transistor NMOS11 is turned on to precharge the node TDC to the voltage VDD.

At the time t12, a bit line precharge voltage Vclamp is applied to the node BLCLAMP. The voltage Vclamp is, for example, 0.5 V+Vt1. The voltage Vt1 is the threshold voltage of the transistor NMOS10. Alternatively, the value of the first term of the voltage Vclamp (the value to be added to the voltage Vt1) is 0.3 to 0.4 V. As mentioned above, in this stage, the bit line BLe is electrically connected to the transistor NMOS10 and the bit line BLe is precharged from the time t13 according to the application of the voltage Vclamp.

At the time t14, the voltage of the signal BLCLAMP is set at 0 V and the bit line BLe is turned into an electrically floating state. Then, through a control of the select gate line SGSL or the like, the potential of the bit line BLe is decreased from the time t16 or kept as it is, depending on the data kept in the cell targeted for reading data.

At the times t17 and t18, when the signal VPRE is in a state of Vss, the node TDC is precharged to VDD by setting the signal BLPRE at Vsg.

At the times t19 and t20, a sense voltage Vsen is applied to the node BLCLAMP. The voltage Vsen is smaller than the voltage Vclamp. Further, a difference between the voltage Vsen and the Vclamp is larger according to the embodiment than in conventional configurations that provides one sense amplifier for two bit lines. Namely, in the method of providing one sense amplifier for two bit lines, the voltage Vsen is smaller than the voltage Vclamp and, for example, it is the sum of the lower value (for example, 0.3 V) than the value of the first term (for example, 0.5 V in the above example) of the voltage Vclamp and the threshold voltage Vt1. In the sense amplifier 3a according to the embodiment, the value of the first term of the voltage Vsen is smaller than the value (for example, 0.3 V) in another example; for example, 0.2 V. Namely, the Vsen in the sense amplifier 3a according to the embodiment is, for example, 0.2 V+Vt1. The value of the first term of Vsen is, for example, less than a half of the value of the first term of Vclamp; for example, 0.15 to 0.2 V. A difference ΔV between the value of the first term of the voltage Vclamp and the value of the first term of the voltage Vsen is determined so as to reduce or cancel the effect of the node TDC from the parasitic leakage current I_offleak.

As a result of application of the voltage Vsen, when the voltage of the select bit line BLe is higher than Vsen−Vt1, the transistor NMOS10 remains off and the VDD is kept in the node TDC. On the other hand, when the potential of the select bit line BLe is smaller than Vsen−Vt1, the transistor NMOS10 is turned on, so that the node TDC is discharged to have almost the same potential as that of the bit line BLe.

Then, the sensed data, namely the potential on the node TDC is taken into the secondary data cache SDC.

The rise of the signal SACLK may be performed also by a memory controller. Namely, the memory 10 is controlled by, for example, an outside memory controller. Then, for example, the memory controller supplies a signal indicating the up amount ΔSACLK to a SACLK driver 11. The SACLK driver 11 outputs a signal SACLK obtained by adding the indicated up amount ΔSACLK to the initial value of the signal SACLK.

As mentioned above, according to the semiconductor memory device of the first embodiment, the voltage of the node SEN at a point of strobe is raised through the rise of the potential of the signal SACLK, so as to compensate a drop of the potential in the node SEN due to the parasitic leakage current. Therefore, it is possible to avoid an undesirable drop of the voltage in the node SEN at the time of the strobe and suppress a decrease of the on and off current ratio. This improves the sense margin, which makes it possible to realize a semiconductor memory device capable of performing a more accurate sense. When the embodiment is applied to a three dimensional memory that is more affected by the parasitic leakage current, the embodiment can improve the reading accuracy significantly.

Second Embodiment

Parasitic off current generally has a temperature dependency. Therefore, in a second embodiment, the up amount ΔSACLK of the signal SACLK is adjusted according to the temperature information.

Figure 8:
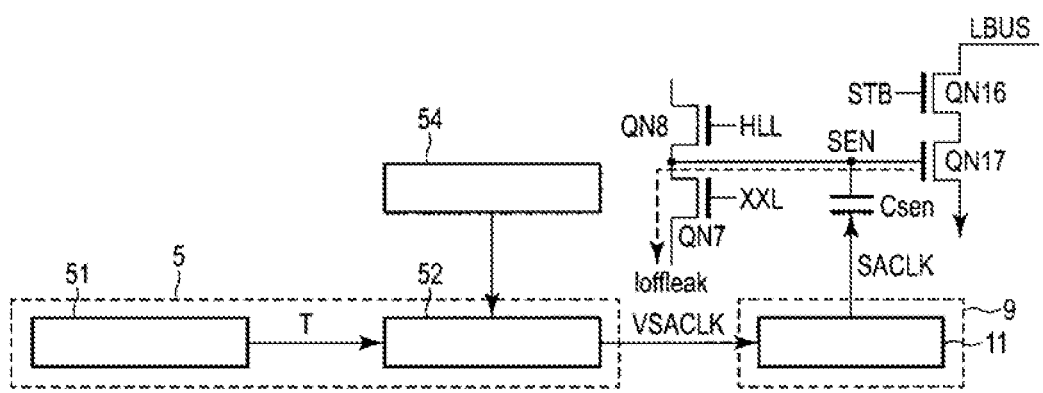
FIG. 8 is a circuit diagram showing a part of a semiconductor memory device according to a second embodiment.

FIG. 8 is a circuit diagram showing a part of a semiconductor memory device according to the second embodiment. Specifically, FIG. 8 is a circuit diagram showing a part of the core driver 9, the data circuit and page buffer 3, and the controlling circuit 5 of FIG. 1; more specifically, it is a circuit diagram of the node SEN and its periphery and the elements concerned to the generation of the signal SACLK in FIG. 2. The node SEN and the elements connected to the node SEN are the same as those in FIG. 3 (the first embodiment) and the other elements are the same as those in FIG. 3.

As illustrated in FIG. 8, the controlling circuit 5 includes a temperature sensor 51 and a SACLK amount determining unit 52. The temperature sensor 51 detects the temperature in the vicinity thereof and supplies temperature information T concerned to the detected temperature to the SACLK amount determining unit 52. The SACLK amount determining unit 52 maps the temperature information T in voltage information VSACLK. The voltage information VSACLK indicates the up amount ΔSACLK of the signal SACLK which is determined according to the temperature detected by the temperature sensor 51. Namely, at first, various values of the decreased amount ΔVSEN of the node SEN based on the parasitic off current, depending on the temperature detected by the temperature sensor 51, are previously obtained. Then, the up amount ΔSACLK for moderating or cancelling the decrease, depending on each value ΔVSEN, is derived from, for example, experiment or simulation. The voltage information VSACLK for specifying the size of ΔSACLK is determined. Then, based on a set of the temperature information T and the corresponding voltage information VSACLK, the voltage information VSACLK based on the received temperature information T is obtained by the SACLK amount determining unit 52. The conversion by this SACLK amount determining unit 52 is performed, for example, by a conversion table 53 previously prepared. As an example, the conversion table is stored in a ROM fuse area 54. The ROM fuse area 54 is prepared as a part of the memory 10. The SACLK amount determining unit 52 reads the conversion table 53 from the ROM fuse area 54, for example, at a time of starting the memory 10 and upon receipt of the temperature information T, it converts the temperature information T into the voltage information VSACLK with reference to the conversion table.

The SACLK amount determining unit 52 supplies the voltage information VSACLK to the SACLK driver 11. The SACLK driver 11 outputs the signal SACLK including the amount of ΔSACLK specified by the voltage information.

The second embodiment can be applied also to the examples of FIGS. 5, 6, and 7 of the first embodiment.

As set forth hereinabove, according to the second embodiment, the voltage of the node SEN at the time of the strobe is raised through the potential rise of the signal SACLK, so as to compensate a decrease of the potential in the node SEN due to the parasitic leakage current, similarly to the first embodiment. Therefore, it can achieve the same advantage as that of the first embodiment. Further, according to the second embodiment, the up amount ΔSACLK is a function of the temperature. Since the potential of the node SEN has the temperature dependency, even in the case of the potential drop in the node SEN due to the parasitic off current, the temperature dependency helps to compensate for the potential drop in the node SEN with high accuracy. Therefore, a semiconductor memory device capable of performing a sense at a higher accuracy can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising: a memory cell; a sense amplifier electrically connected to the memory cell and including a node for sensing a voltage during a sense operation; and a controller configured to perform the sense operation and a strobe operation during a read operation, and including a sense node driver that is configured to raise the voltage of the node, by outputting a first voltage during the sense operation and outputting a second voltage during the strobe operation, the first voltage being higher than the second voltage, wherein the voltage of the node is raised by a first amount during the sense operation and by a second amount during the strobe operation, the first amount being greater than the second amount.

2. The semiconductor memory device according to claim 1, wherein
the sense amplifier includes a data latch that is electrically connected to the node and configured to hold a voltage corresponding to the voltage of the node when a strobe signal is issued during the strobe operation.

3. The semiconductor memory device according to claim 1, wherein the voltage of the node is raised by the first amount at the start of the sense operation and by the second amount before a strobe signal is issued during the strobe operation.

4. The semiconductor memory device according to claim 1, wherein
the voltage of the node is maintained at the raised voltage during the strobe operation after being raised thereto.

5. The semiconductor memory device according to claim 1, wherein
the memory cell is one of a plurality of memory cells of a memory array in which word lines are each connected to a plurality of memory cells across different memory string groups.

6. The semiconductor memory device according to claim 1, further comprising:
a temperature sensor, wherein
the controller is configured to adjust values of the first and second voltages according to a temperature detected by the temperature sensor.

7. The semiconductor memory device according to claim 1, wherein
an output voltage of the sense node driver is increased to the first voltage at the start of the sense operation, and to the second voltage during the strobe operation.

8. The semiconductor memory device according to claim 7, wherein
the output voltage of the sense node driver is decreased from the first voltage to a predetermined voltage that is lower than the second voltage at the end of the sense operation.

9. The semiconductor memory device according to claim 7, wherein
the output voltage of the sense node driver is maintained at the second voltage during the strobe operation after being increased thereto.

10. The semiconductor memory device according to claim 7, wherein
the output voltage of the sense node driver is increased to the second voltage before a strobe signal is issued during the storage operation.

11. A semiconductor memory device, comprising:
a memory cell;
a sense amplifier electrically connected to the memory cell and including a node for sensing a voltage during a sense operation; and
a controller configured to perform the sense operation and a strobe operation during a read operation, the controller including a sense node driver that is configured to cause the voltage of the node to increase by a first amount during the sense operation and by a second amount during the strobe operation, the first amount being greater than the second amount.

12. The semiconductor memory device according to claim 11, wherein
the sense amplifier includes a data latch that is electrically connected to the node and configured to hold a voltage corresponding to the voltage of the node when a strobe signal is issued during the strobe operation.

13. The semiconductor memory device according to claim 11, wherein
the voltage of the node is increased by the first amount at the start of the sense operation and by the second amount before a strobe signal is issued during the strobe operation.

14. The semiconductor memory device according to claim 11, wherein
the voltage of the node is maintained at the raised voltage during the strobe operation after being increased thereto.

15. The semiconductor memory device according to claim 11, wherein
the memory cell is one of a plurality of memory cells of a memory array in which word lines are each connected to a plurality of memory cells across different memory string groups.

16. The semiconductor memory device according to claim 11, further comprising:
a temperature sensor, wherein
the controller is configured to cause the first and second amounts to be adjusted according to a temperature detected by the temperature sensor.

17. The semiconductor memory device according to claim 11, wherein
the sense node driver causes the voltage of the node to increase by the first amount by raising an output voltage thereof by the first amount, and causes the voltage of the node to increase by the second amount by raising the output voltage thereof by the second amount.

* * * * *